(12) United States Patent
Huang et al.

(10) Patent No.: US 11,765,842 B2
(45) Date of Patent: Sep. 19, 2023

(54) DISPLAY DEVICES

(71) Applicant: InnoLux Corporation, Miao-Li County (TW)

(72) Inventors: Yao-Lin Huang, Miao-Li County (TW); Ta-Chin Huang, Miao-Li County (TW); Chou-Yu Kang, Miao-Li County (TW); Li-Wei Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 53 days.

(21) Appl. No.: 17/521,987

(22) Filed: Nov. 9, 2021

(65) Prior Publication Data

US 2022/0183164 A1 Jun. 9, 2022

(30) Foreign Application Priority Data

Dec. 7, 2020 (CN) .......................... 202011429849.2

(51) Int. Cl.
*G02F 1/1333* (2006.01)
*H05K 5/00* (2006.01)

(52) U.S. Cl.
CPC ................. *H05K 5/0017* (2013.01)

(58) Field of Classification Search
None
See application file for complete search history.

(56) References Cited

U.S. PATENT DOCUMENTS

| | | | |
|---|---|---|---|
| 9,872,407 B2* | 1/2018 | Inobe | H05K 5/03 |
| 9,888,588 B2* | 2/2018 | Esterbauer | G02F 1/133308 |
| 10,222,837 B1* | 3/2019 | Budinich | H04M 1/0266 |
| 10,881,015 B2* | 12/2020 | Jarvis | H05K 7/026 |
| 11,252,834 B2* | 2/2022 | Cao | H04M 1/0202 |
| 2011/0261517 A1* | 10/2011 | Fuke | H04M 1/18 361/679.01 |
| 2012/0281383 A1* | 11/2012 | Hwang | G02B 30/25 361/807 |
| 2017/0184909 A1* | 6/2017 | Kang | G02F 1/133308 |
| 2017/0196108 A1* | 7/2017 | Inobe | H05K 5/0017 |
| 2018/0088389 A1* | 3/2018 | Furuta | B23K 1/0008 |
| 2018/0149903 A1* | 5/2018 | Kim | G02F 1/133308 |
| 2019/0101960 A1* | 4/2019 | Silvanto | G06F 1/181 |
| 2021/0168958 A1* | 6/2021 | Choi | H04B 1/3833 |
| 2021/0204415 A1* | 7/2021 | Mei | H05K 5/0247 |

FOREIGN PATENT DOCUMENTS

| | | |
|---|---|---|
| CN | 106814489 A | 6/2017 |
| CN | 210467104 U | 5/2020 |
| TW | 201907208 A | 2/2019 |

\* cited by examiner

*Primary Examiner* — Xanthia C Cunningham
(74) *Attorney, Agent, or Firm* — McClure, Qualey & Rodack, LLP (57) ABSTRACT

A display device is provided. The display device includes a display panel set having a peripheral zone, a backlight module including a frame, an adhesive material disposed between the peripheral zone of the display panel set and the frame, and a plurality of support elements disposed on the frame and in contact with the adhesive material.

17 Claims, 10 Drawing Sheets

DISPLAY DEVICES

CROSS REFERENCE TO RELATED APPLICATIONS

This application claims priority of China Patent Application No. 202011429849.2, filed on Dec. 7, 2020, the entirety of which are incorporated by reference herein.

BACKGROUND

Technical Field

The present disclosure relates to a display device, and in particular it relates to a display device with a support element disposed on a frame.

Description of the Related Art

In general, automotive touch displays (such as digital instrument panels, driving navigation displays, air-conditioning control panels, digital rearview mirrors, etc.) can use double-sided tape to affix the display panel set to the backlight module. However, if the adhesive width of the tape is too wide, it will affect the visual quality, while if the width is too narrow, it will impair the adhesion of the components.

At present, there is a way of using glue instead of double-sided tape to adhere and affix components. However, this glue requires a certain amount of time to cure. When the glue has not yet cured, the display device will deviate due to external forces during the manufacturing process, making it impossible to transport the product while the glue is still curing. Therefore, finding a way to shorten the curing time is an important issue. In the curing process, the product must be kept level, otherwise the thickness of the glue after curing will be different, resulting in poor parallelism between the display panel or touch screen and the backlight module, which will affect the display quality or the accuracy of touch.

SUMMARY

In accordance with some embodiments of the present disclosure, a display device is provided. The display device includes a display panel set having a peripheral zone; a backlight module including a frame; an adhesive material disposed between the peripheral zone of the display panel set and the frame; and a plurality of support elements disposed on the frame and in contact with the adhesive material.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method. In accordance with some embodiments, some of the stages (or steps) described below may be replaced or omitted.

In this specification, spatial terms may be used, such as "below", "lower", "above", "higher" and similar terms, for briefly describing the relationship between an element relative to another element in the figures. Besides the directions illustrated in the figures, the devices may be used or operated in different directions. When the device is turned in different directions (such as if it is rotated 45 degrees or other amounts), the spatially related adjectives used in it will also be interpreted according to the turned position. Furthermore, in this specification, expressions such as "first material layer disposed on/over a second material layer", may indicate direct contact of the first material layer with the second material layer, or it may indicate a non-contact state with one or more intermediate layers between the first material layer and the second material layer. In the above situation, the first material layer may not be in direct contact with the second material layer. In some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Herein, the terms "about", "around" and "substantially" typically mean a value is in a range of +/−20% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value. The stated value of the present disclosure is an approximate value. Namely, the meaning of "about", "around" and "substantially" still exists even if there is no specific description of "about", "around" and "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section from another element, component, region, layer, portion or section from another element, component, region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Figure 1:
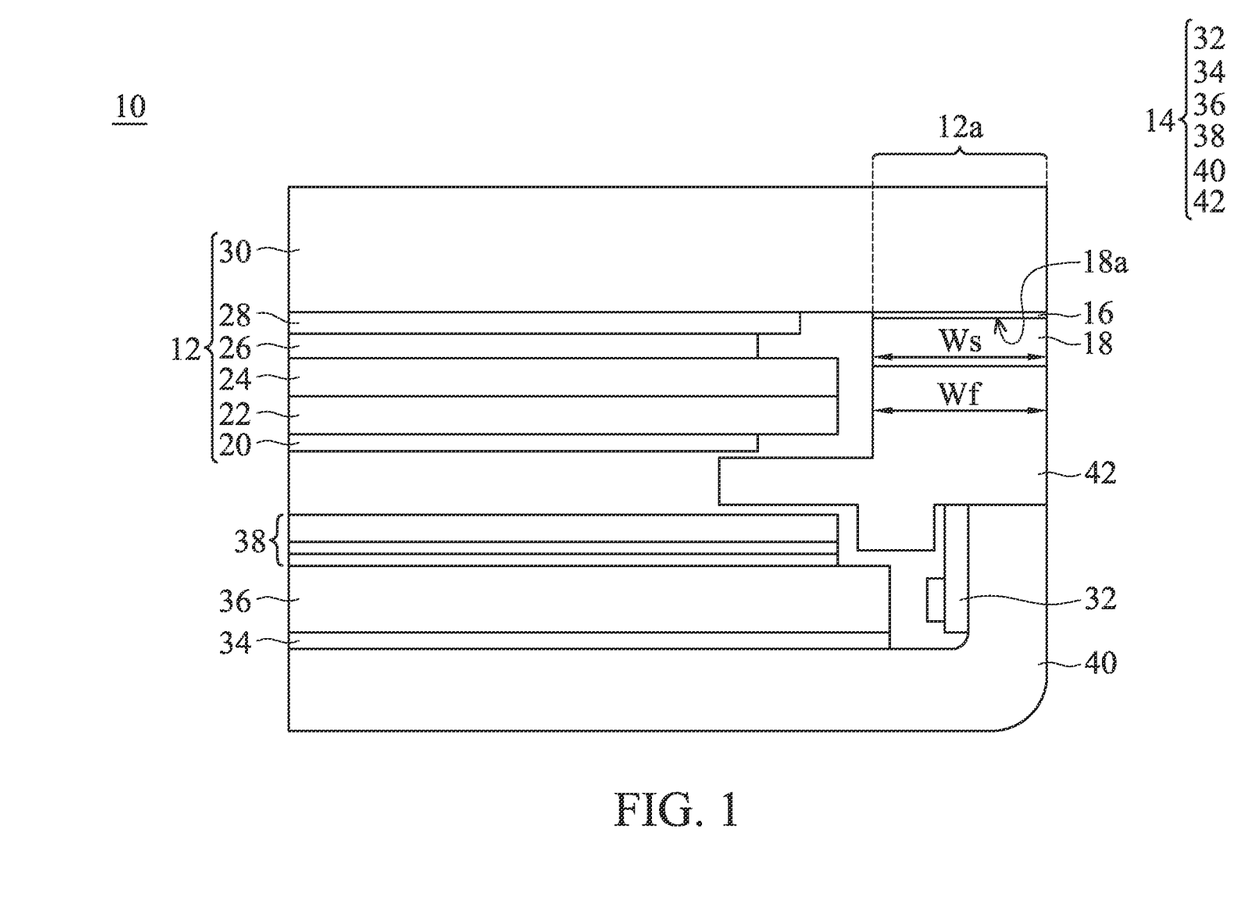
FIG. 1 is a schematic cross-sectional view of a display device in accordance with some embodiments of the present disclosure.

Referring to FIG. 1, in accordance with some embodiments of the present disclosure, a display device 10 is provided. FIG. 1 is a schematic cross-sectional view of the display device 10.

In FIG. 1, the display device 10 includes a display panel set 12, a backlight module 14, an adhesive material 16 and a support element 18. The display panel set 12 has a peripheral zone 12a and includes a lower polarizing film 20, a thin-film transistor layer 22, a color filter layer 24, an upper polarizing film 26, an optical glue 28 and a glass cover 30, but the present disclosure is not limited thereto. In the display panel set 12, the arrangement of each component is as follows, but the present disclosure is not limited thereto, for example, the thin-film transistor layer 22 is disposed on the lower polarizing film 20. The color filter layer 24 is disposed on the thin-film transistor layer 22. The upper polarizing film 26 is disposed on the color filter layer 24. The optical glue 28 is disposed on the upper polarizing film 26. The glass cover 30 is disposed on the optical glue 28.

The backlight module 14 includes a light source module 32, a reflective sheet 34, a light guide plate 36, an optical film set 38, a back plate 40 and a frame 42, but the present disclosure is not limited thereto. In some embodiments, the light source module 32 may include light-emitting diodes (LEDs), but the present disclosure is not limited thereto. The light-emitting diodes may include organic light-emitting diodes (OLEDs), inorganic light-emitting diodes, mini LEDs, micro LEDs or quantum dot LEDs (QLEDs/QDLEDs), but the present disclosure is not limited thereto. In some embodiments, the optical film set 38 may include a lower diffuser film, an upper diffuser film, a lower brightness enhancement film, an upper brightness enhancement film or a prism sheet, but the present disclosure is not limited thereto. In some embodiments, the material of the frame 42 may include metal, for example, gold, silver, copper, iron, aluminum, tin, manganese or zinc, but the present disclosure is not limited thereto. In some embodiments, the material of the frame 42 may include plastic, for example, thermoplastic plastic or thermosetting plastic, but the disclosure is not limited thereto. In some embodiments, the material of the frame 42 may include polymer fibers, for example, plant fibers, wood fibers, animal fibers or mineral fibers, but the present disclosure is not limited thereto. In the backlight module 14, the components are disposed as follows, but the present disclosure is not limited thereto, for example, the reflective sheet 34 is disposed on the back plate 40 and located on one side of the back plate 40. The light guide plate 36 is disposed on the reflective sheet 34. The optical film set 38 is disposed on the light guide plate 36. The light source module 32 is disposed on the back plate 40 and located on the other side of the back plate 40, opposite to the reflective sheet 34, the light guide plate 36 and the optical film set 38. The frame 42 is disposed on the back plate 40. The frame 42 and the light source module 32 are located on the same side of the back plate 40.

In some embodiments, the adhesive material 16 may include solid glue, liquid glue, semi-solid glue, semi-liquid glue or any glue with adhesiveness. In some embodiments, the adhesive material 16 may include tape, for example, double-sided tape or single-sided tape, but the present disclosure is not limited thereto. In some embodiments, the adhesive material 16 may include solvent-volatilization-type glue, for example, instant glue or super glue, but the present disclosure is not limited thereto. In some embodiments, the adhesion material 16 may include polymerization-type glue, for example, epoxy resin AB glue, but the present disclosure is not limited thereto. In some embodiments, the adhesive material 16 may include cooling-solidification-type glue, for example, hot-melt glue, but the present disclosure is not limited thereto. In some embodiments, the material of the support element 18 may include metal, for example, gold, silver, copper, iron, aluminum, tin, manganese or zinc, but the present disclosure is not limited thereto. In some embodiments, the material of the support element 18 may include plastic, for example, thermoplastic plastic or thermosetting plastic, but the disclosure is not limited thereto. In some embodiments, the material of the support element 18 may include polymer fibers, for example, plant fibers, wood fibers, animal fibers or mineral fibers, but the present disclosure is not limited thereto. In some embodiments, since the support element 18 and the frame 42 are integrally formed, the support element 18 and the frame 42 are made of the same material. In some embodiments, the support element 18 and the frame 42 may also be made of different materials. In some embodiments, the support element 18 may also include solid glue, liquid glue, semi-solid glue, semi-liquid glue or any glue with adhesiveness. In some embodiments, the support element 18 may include tape, for example, double-sided tape or single-sided tape, but the present disclosure is not limited thereto. In some embodiments, the support element 18 may include solvent-volatilization-type glue, for example, instant glue or super glue, but the present disclosure is not limited thereto. In some embodiments, the support element 18 may include polymerization-type glue, for example, epoxy resin AB glue, but the present disclosure is not limited thereto. In some embodiments, the support element 18 may include cooling-solidification-type glue, for example, hot-melt glue, but the present disclosure is not limited thereto. The adhesive material 16 is disposed between the glass cover 30 of the display panel set 12 and the frame 42. The support element 18 is disposed on the frame 42 and in contact with the adhesive material 16. That is, the display panel set 12 is fixed on the frame 42 of the backlight module 14 by the support element 18 and the adhesive material 16. In some embodiments, a pre-fixing material layer (not shown) is further disposed on the support element 18 to strengthen the pre-fixing operation of the display panel set 12. In some embodiments, the pre-fixing material layer disposed on the support element 18 may include solid glue, liquid glue, semi-solid glue, semi-liquid glue or any glue with adhesiveness. In some embodiments, the pre-fixing material layer may include tape, for example, double-sided tape or single-sided tape, but the present disclosure is not limited thereto. In some embodiments, the pre-fixing material layer may include solvent-volatilization-type glue, for example, instant glue or super glue, but the present disclosure is not limited thereto. In some embodiments, the pre-fixing material layer may include polymerization-type glue, for example, epoxy resin AB glue, but the present disclosure is not limited thereto. In some embodiments, the pre-fixing material layer may include cooling-solidification-type glue, for example, hot-melt glue, but the present disclosure is not limited thereto. In some embodiments, the support element 18 and the pre-fixing material layer thereon have the same material. In some embodiments, the support element 18 and the pre-fixing material layer thereon may also be made of different materials.

In FIG. 1, the width "Ws" of the support element 18 is approximately the same as the width "Wf" of the frame 42. Therefore, the adhesive material 16 is located on the top 18a of the support element 18.

Figure 2:
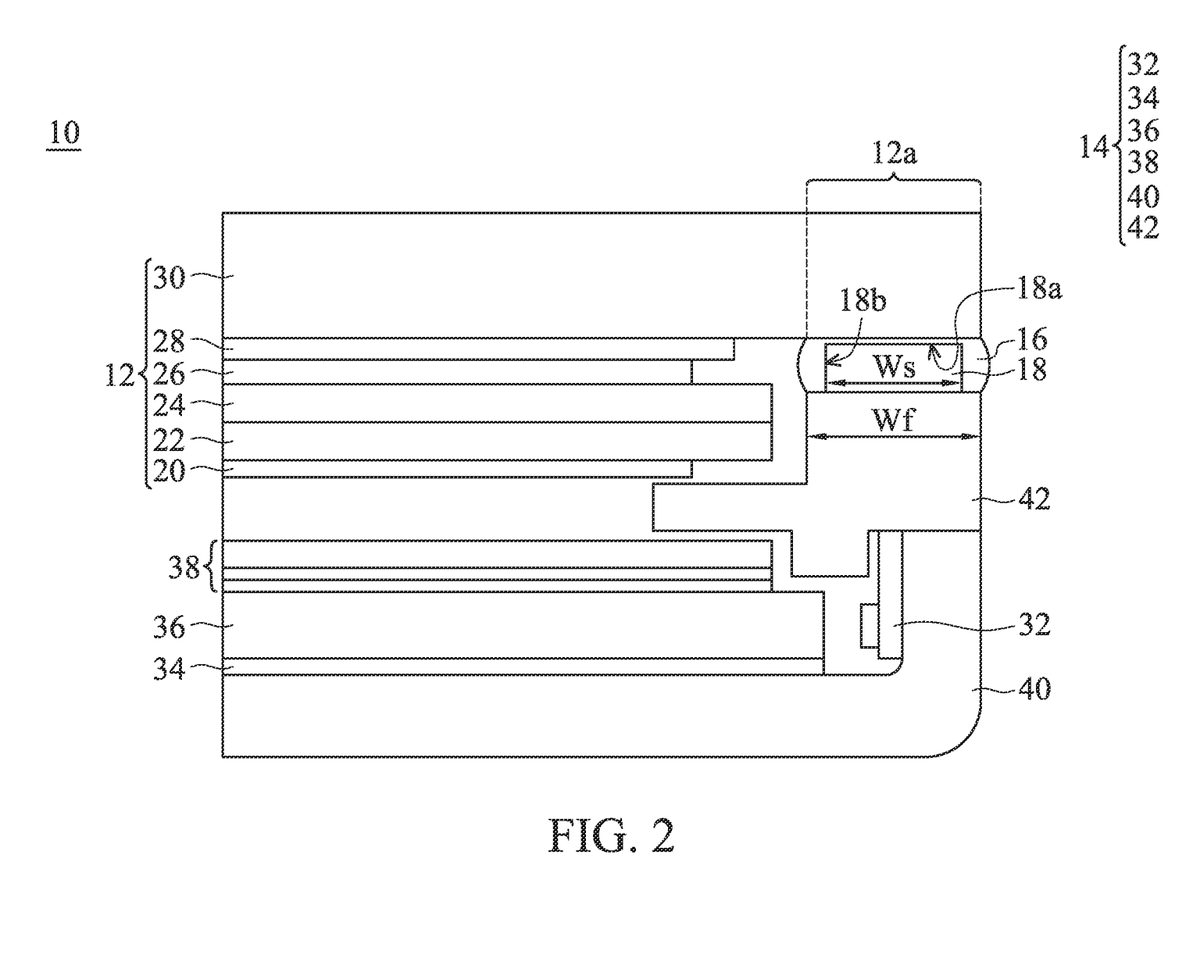
FIG. 2 is a schematic cross-sectional view of a display device in accordance with some embodiments of the present disclosure.

Referring to FIG. 2, in accordance with some embodiments of the present disclosure, a display device 10 is provided. FIG. 2 is a schematic cross-sectional view of the display device 10.

The structural composition of the display device 10 shown in FIG. 2 is similar to that of the display device 10 shown in FIG. 1. The same structural composition, component material and component disposition method as in FIG. 1 will not be repeated here. In FIG. 2, the width "Ws" of the support element 18 is smaller than the width "Wf" of the frame 42. Therefore, in FIG. 2, the adhesive material 16 is located at the top 18a and the sidewall 18b of the support element 18 at the same time.

As shown in FIGS. 1 and 2, the support element 18 is disposed on the frame 42, and the adhesive material 16 is disposed on the top 18a of the support element 18 or disposed on the top 18a and sidewalls 18b of the support element 18 to shorten the curing time. When the adhesive material 16 has not been cured, the support element 18 can adhere and fix the display panel set 12 and the backlight module 14. Even if they are squeezed by an external force during the manufacturing process, the occurrence of deviation can be reduced. The support element 18 enhances the support strength for the display panel set 12, and can easily control the thickness of the adhesive material 16 after curing. The parallelism that meets product specifications can thus be obtained between the display panel set 12 and the backlight module 14, but the present disclosure is not limited thereto.

In addition, in order to have the ability to resist external horizontal lateral force and vertical lateral force at the same time, or have the ability to resist rotational torque, the upper and lower support surfaces of the support element can also provide adhesion through its own material characteristics, or the support element can be additionally covered or coated by an adhesive material to enhance the effect of gripping, but the present disclosure is not limited thereto.

In the present disclosure, the support element is disposed on the frame, and then the adhesive material is coated thereon. The method of coating the adhesive material includes continuous coating (the adhesive material is covered on the support element), or discontinuous coating, for example, avoiding the support element during coating, and not covering the support element with the adhesive material. The method of coating also includes segmented or spot coating, but the present disclosure is not limited thereto.

The number, shape, dimension and location of the support elements 18 on the frame 42 are detailed in FIGS. 3-10, but the present disclosure is not limited thereto.

Figure 3:
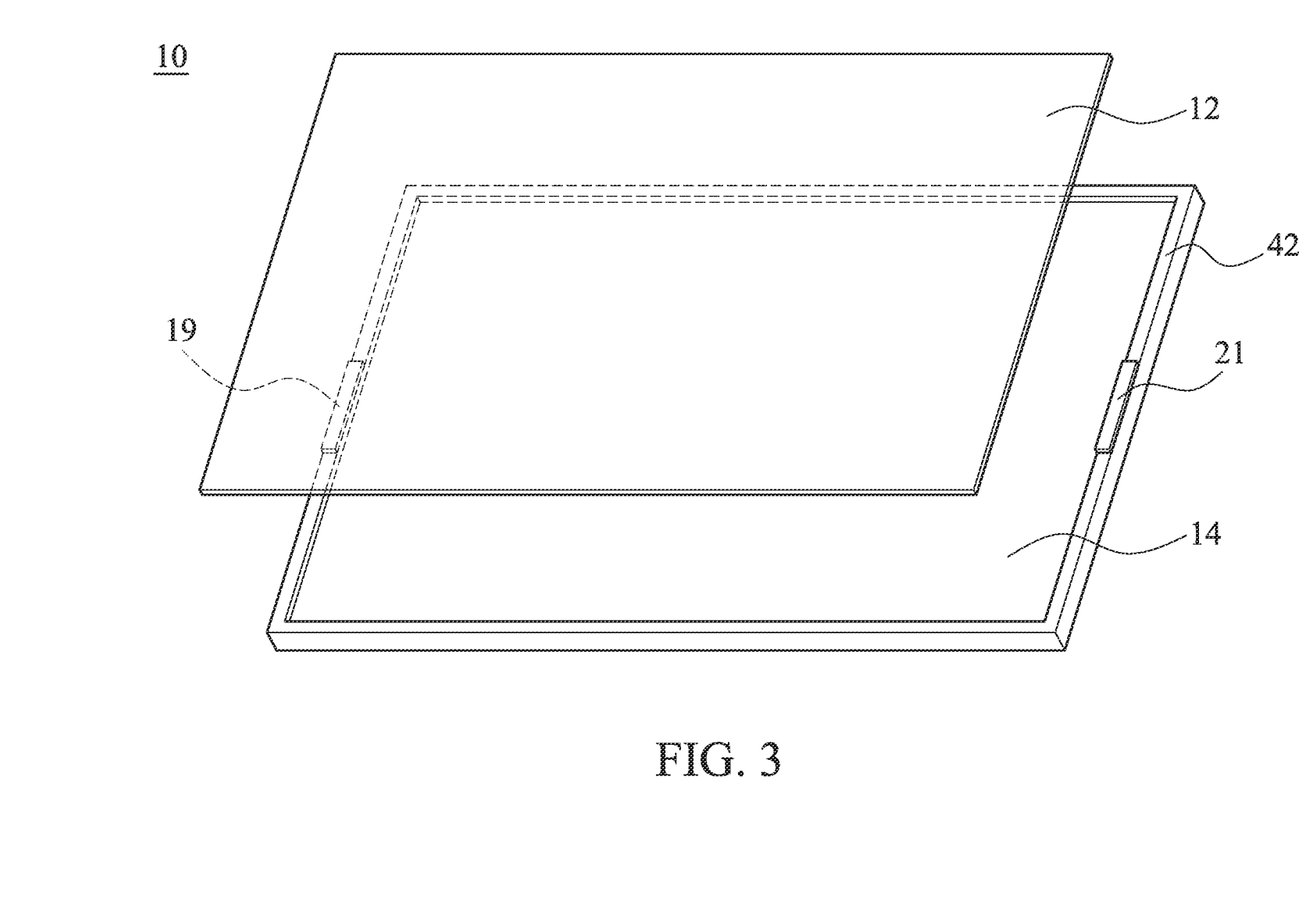
FIG. 3 is a schematic perspective view of a display device in accordance with some embodiments of the present disclosure.

Referring to FIG. 3, in accordance with some embodiments of the present disclosure, a display device 10 is provided. FIG. 3 is a schematic perspective view of the display device 10.

In FIG. 3, the display device 10 includes a display panel set 12, a backlight module 14, a first support element 19 and a second support element 21. The structural composition and component arrangement of the display panel set 12 shown in FIG. 3 are similar to those of the display panel set 12 shown in FIG. 1, and will not be repeated here. The structural composition, component materials and component arrangement of the backlight module 14 shown in FIG. 3 are similar to those of the backlight module 14 shown in FIG. 1, and will not be repeated here. The material of the first support element 19 and the second support element 21 shown in FIG. 3 is similar to that of the support element 18 shown in FIG. 1, and will not be repeated here. In the embodiment shown in FIG. 3, there are two support elements provided on the frame 42, namely the first support element 19 and the second support element 21.

Figure 4:
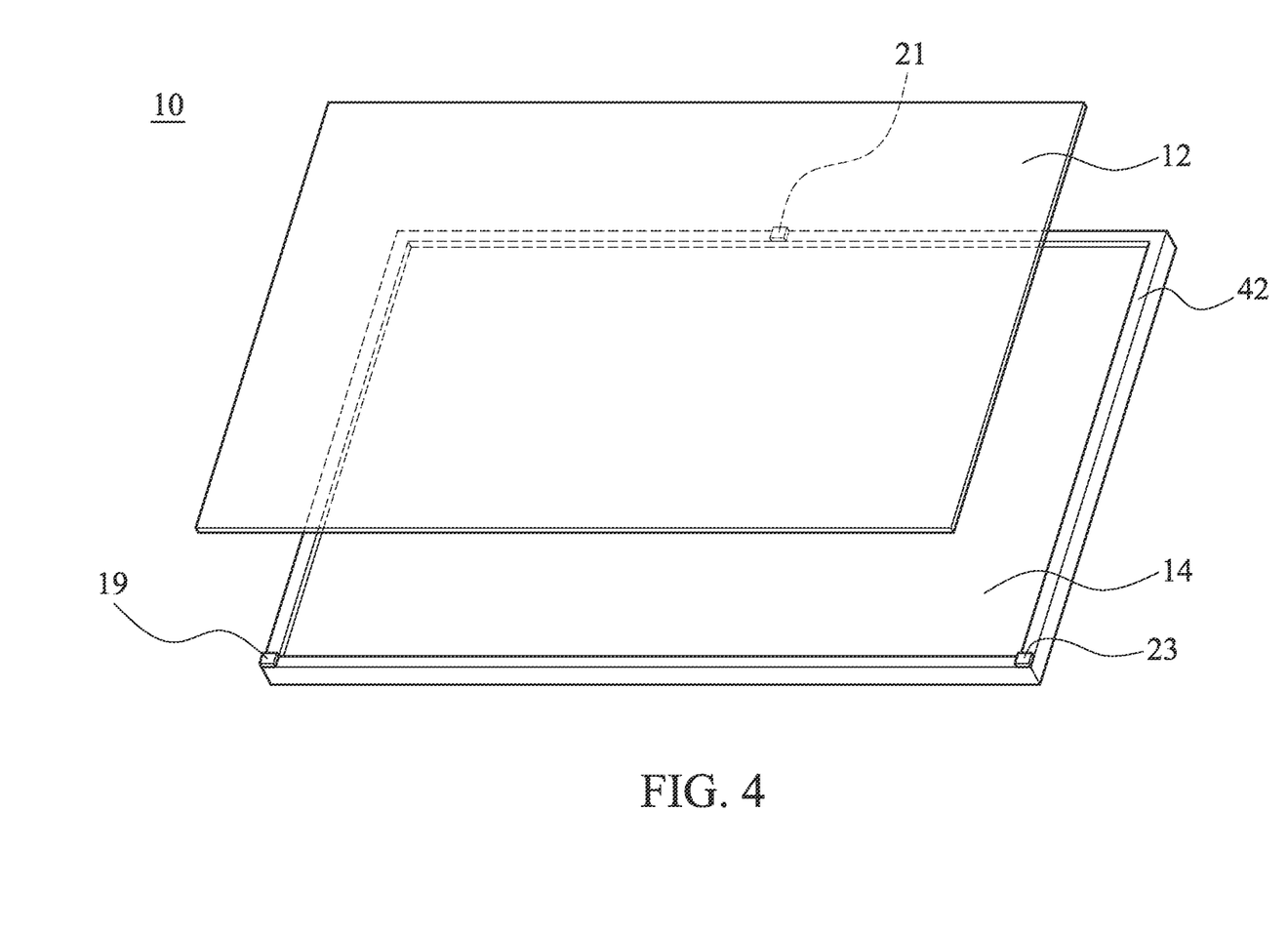
FIG. 4 is a schematic perspective view of a display device in accordance with some embodiments of the present disclosure.

Referring to FIG. 4, in accordance with some embodiments of the present disclosure, a display device 10 is provided. FIG. 4 is a schematic perspective view of the display device 10.

In FIG. 4, the display device 10 includes a display panel set 12, a backlight module 14, a first support element 19, a second support element 21 and a third support element 23. The structural composition and component arrangement of the display panel set 12 shown in FIG. 4 are similar to those of the display panel set 12 shown in FIG. 1, and will not be repeated here. The structural composition, component materials and component arrangement of the backlight module 14 shown in FIG. 4 are similar to those of the backlight module 14 shown in FIG. 1, and will not be repeated here. The material of the first support element 19, the second support element 21 and the third support element 23 shown in FIG. 4 is similar to that of the support element 18 shown in FIG. 1, and will not be repeated here. In the embodiment shown in FIG. 4, there are three support elements provided on the frame 42, namely the first support element 19, the second support element 21 and the third support element 23.

In order to maintain a stable support force for the display panel set, in addition to disposing the support elements on the frame, there must be at least two support elements. The regional surface support formed by two or more support elements provides sufficient support area to bear external stress.

In some embodiments, when there are two support elements (as shown in FIG. 3, for example: the first support element 19 and the second support element 21), the shape of the support element may be a circle or a square. For example, a solid cylinder, a hollow cylinder, a solid square column or a hollow square column, but the present disclosure is not limited thereto. Other shapes that can provide sufficient support area to bear the applied stress of the display panel set 12 are also applicable to the present disclosure. In some embodiments, the support element whose appearance is a hollow cylinder or a hollow square column may include one or more through holes. In some embodiments, the adhesive material can be filled into the through holes in the support element, but the present disclosure is not limited thereto.

When there are two support elements, the shape of the support elements may be a cylinder or a square column, or a hollow ring structure. The large plane constructed by the two support contact surfaces of the support elements provides a sufficient support area to bear the compressive stress of the display panel set, but the present disclosure is not limited thereto.

Figure 5:
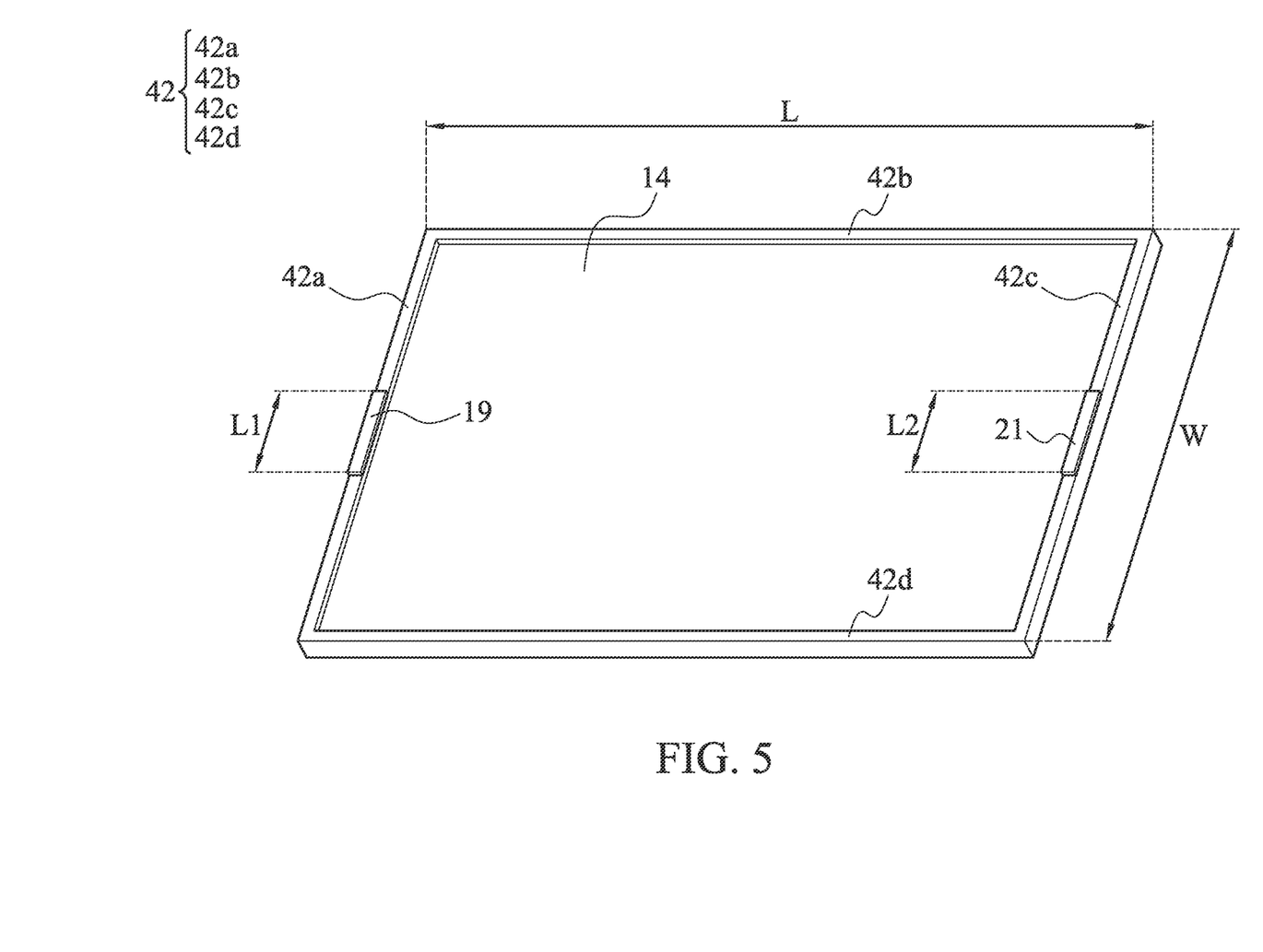
FIG. 5 is a schematic top view of some components of a display device in accordance with some embodiments of the present disclosure.

Referring to FIG. 5, according to some embodiments of the present disclosure, when there are two support elements in the display device, the appropriate dimensional relationship of the support elements is as illustrated. FIG. 5 is a schematic top view of some components of the display device. The rectangular backlight module 14 is used as an example for illustration, but the present disclosure is not limited thereto.

In FIG. 5, the first support element 19 and the second support element 21 are disposed on the frame 42 of the backlight module 14. The frame 42 is disposed along the edge of the rectangular backlight module 14. The frame 42 includes a first portion 42a, a second portion 42b, a third portion 42c and a fourth portion 42d. The first portion 42a is opposite to the third portion 42c. The second portion 42b is opposite to the fourth portion 42d. The first portion 42a connects the second portion 42b and the fourth portion 42d. The third portion 42c connects the second portion 42b and the fourth portion 42d. As shown in FIG. 5, the length of the first support element 19 is L1. The length of the second support element 21 is L2. The length of any long side (the second portion 42b or the fourth portion 42d) of the frame 42 is L. The width of any short side (the first portion 42a or the third portion 42c) is W. The perimeter of the frame 42 is 2(L+W). In some embodiments, the ratio of the total length (L1+L2) of the first support element 19 and the second support element 21 to the perimeter (2(L+W)) of the frame 42 is less than or equal to about ¼ and greater than or equal to about ¹⁄₁₀. In some embodiments, the value range of the total length (L1+L2) of the first support element 19 and the second support element 21, when applied to a display area below 5 inch to 13 inch, may be less than or equal to about 250 mm and greater than or equal to about 30 mm. When applied to a display area of 13 inch to 60 inch, it may be less than or equal to about 800 mm and greater than or equal to about 250 mm. In the embodiment shown in FIG. 5, the shape of the backlight module 14 is rectangular, but the present disclosure is not limited thereto. Other suitable shapes for the backlight module 14 are also applicable to the present disclosure, for example, oval or irregular. It is necessary to measure the ratio of the total length (L1+L2) of the first support element 19 and the second support element 21 to the perimeter (2(L+W)) of the frame 42 to be less than or equal to about ¼ and greater than or equal to about ¹⁄₁₀, or the value range of the total length (L1+L2) of the first support element 19 and the second support element 21 to be less than or equal to about 250 mm and greater than or equal to about 30 mm, or the value range of the total length (L1+L2) of the first support element 19 and the second support element 21 to be less than or equal to about 800 mm and greater than or equal to about 250 mm.

When there are two support elements, and when the width of each structure must be 0.5 mm or more, the total length of the two support elements must be at least ¹⁄₁₀ or more of the perimeter of the frame, and no more than ¼ of the perimeter of the frame.

In some embodiments, the shape of the contact surface between the support element and the frame may include a long strip, an ellipse, a circle, a curve or an L shape, but the present disclosure is not limited thereto. The support element can be correspondingly disposed on the frame of various shapes.

Figure 6:
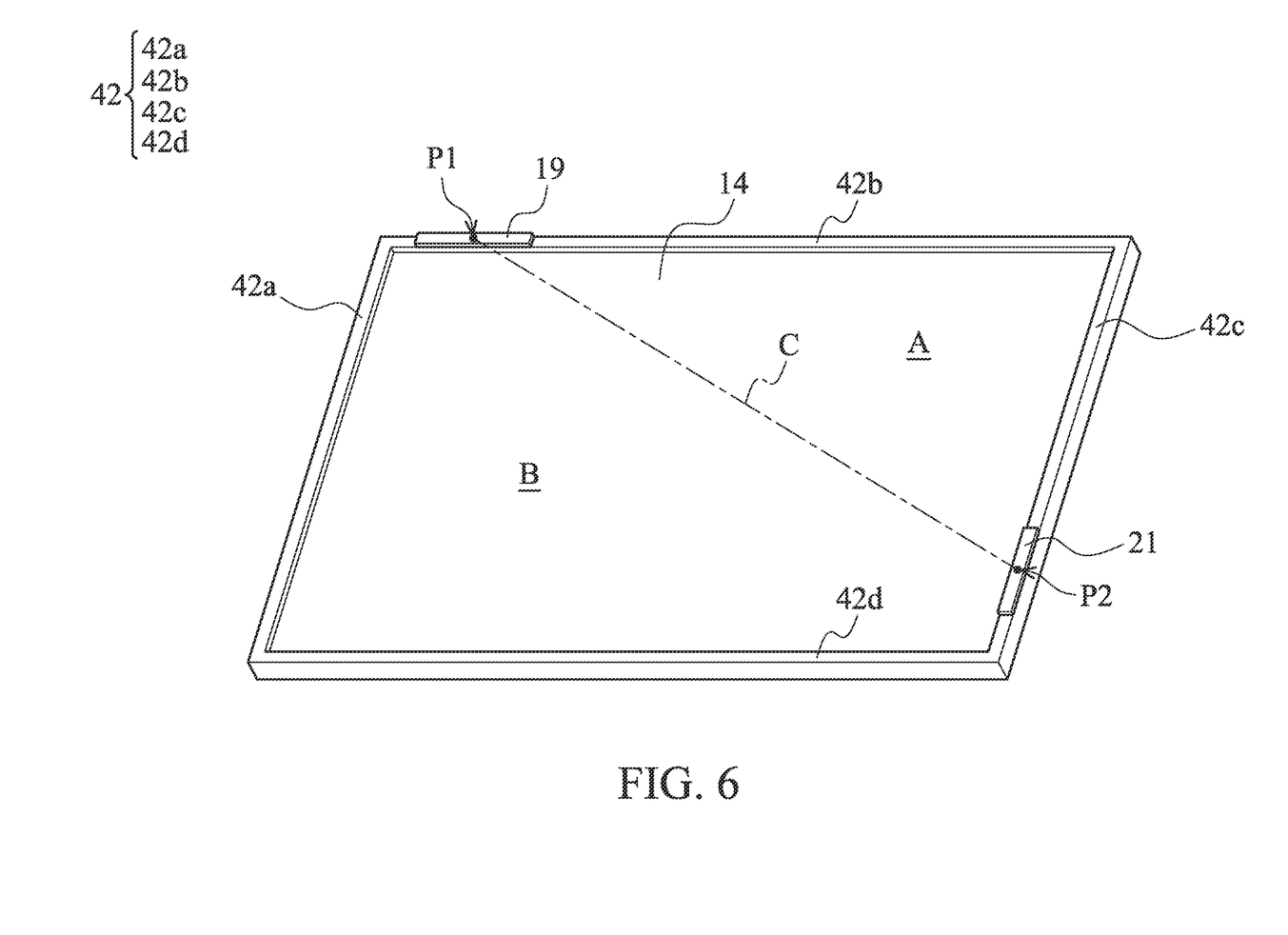
FIG. 6 is a schematic top view of some components of a display device in accordance with some embodiments of the present disclosure.

Referring to FIG. 6, according to some embodiments of the present disclosure, when there are two support elements in the display device, the appropriate position for the support elements is illustrated. FIG. 6 is a schematic top view of some components of the display device. The rectangular backlight module 14 is used as an example for illustration, but the present disclosure is not limited thereto. Other suitable shapes for the backlight module 14 are also suitable for the present disclosure, such as oval or irregular shapes, etc.

In FIG. 6, the first support element 19 and the second support element 21 are disposed on the frame 42 of the backlight module 14. The frame 42 is disposed along the edge of the rectangular backlight module 14. The structural configuration of the frame 42 shown in FIG. 6 is similar to that of the frame 42 shown in FIG. 5. As shown in FIG. 6, the first support element 19 is disposed on the second portion 42b of the frame 42 adjacent to the first portion 42a of the frame 42. The second support element 21 is disposed on the third portion 42c of the frame 42 adjacent to the fourth portion 42d of the frame 42. The connecting line "C" between the center point "P1" of the first support element 19 and the center point "P2" of the second support element 21 divides the area enclosed by the frame 42 into a first area "A" and a second area "B". It is worth noting that the area of the first area A is smaller than the area of the second area B, and the ratio of the area of the first area A to the area of the second area B is greater than or equal to about ¾. In the embodiment shown in FIG. 6, the first support element 19 and the second support element 21 are disposed on the frame 42 of the backlight module 14 in an asymmetrical manner. In some embodiments, other methods of disposing the first support element 19 and the second support element 21 asymmetrically are also applicable to the present disclosure. For example, in some embodiments, the first support element is disposed across the first portion 42a and the second portion 42b of the frame in an L shape, and the second support element is disposed on the third portion 42c of the frame, adjacent to the fourth portion 42d of the frame. The connecting line between the center point of the first support element and the center point of the second support element divides the area enclosed by the frame into a first area and a second area. Similarly, the area of the first area is smaller than the area of the second area, and the ratio of the area of the first area to the area of the second area is greater than or equal to about ¾. In some embodiments, the first support element is disposed on the first portion 42a of the frame, adjacent to the second portion 42b of the frame. The second support element is disposed anywhere on the third portion 42c of the frame. The connecting line between the center point of the first support element and the center point of the second support element divides the area enclosed by the frame into a first area and a second area. Similarly, the area of the first area is smaller than the area of the second area, and the ratio of the area of the first area to the area of the second area is greater than or equal to about ¾.

In some embodiments, the first support element 19 and the second support element 21 may also be symmetrically disposed on the frame 42 of the backlight module 14. For example, in some embodiments, the first support element is disposed on the center point of the second portion 42b of the frame. The second support element is disposed on the center point of the fourth portion 42d of the frame. The first support element is disposed opposite to the second support element. The connecting line between the center point of the first support element and the center point of the second support element divides the area enclosed by the frame into a first area and a second area. At this time, the area of the first area is approximately the same as the area of the second area. That is, the ratio of the area of the first area to the area of the second area is approximately 1 (that is, greater than ¾). In some embodiments, the first support element is disposed on the center point of the first portion 42a of the frame. The second support element is disposed on the center point of the third portion 42c of the frame. The first support element and the second support element are disposed opposite to each other. The connecting line between the center point of the first support element and the center point of the second support element divides the area enclosed by the frame into a first area and a second area. At this time, the area of the first area is approximately the same as the area of the second area. That is, the ratio of the area of the first area to the area of the second area is approximately 1 (that is, greater than ¾). In some embodiments, the first support element is disposed across the first portion 42a and the fourth portion 42d of the frame in an L shape. The second support element is disposed across the second portion 42b and the third portion 42c of the frame in an L shape. e first support element and the second support element are disposed opposite to each other. The connecting line between the center point of the first support element and the center point of the second support element divides the area enclosed by the frame into a first area and a second area. At this time, the area of the first area is approximately the same as the area of the second area. That is, the ratio of the area of the first area to the area of the second area is approximately 1 (that is, greater than ¾).

In some embodiments, when there are three support elements (as shown in FIG. 4, for example: the first support element 19, the second support element 21 and the third support element 23), the shape of the support element may be a circle or a square, or it may be a solid cylinder, a hollow cylinder, a solid square column, a hollow square column, a solid cone, a solid square cone, a solid truncated cone, a solid truncated square cone, a solid hemispherical cone or a solid hemispherical square cone, but the present disclosure is not limited thereto. Other shapes that can provide sufficient support area to bear the applied stress of the display panel set 12 are also applicable to the present disclosure. In some embodiments, the support element whose appearance is a hollow cylinder or a hollow square column may include one or more through holes. In some embodiments, the adhesive material can be filled into the through holes in the support element, but the present disclosure is not limited thereto.

When there are three or more support elements, the shape may be a columnar structure or a hollow ring structure. Applicable shapes may further include a cone structure (a cone or a square cone), or a truncated cone structure or a hemispherical cone structure. The support type of the support element is extended from the original support-surface contact to a large plane constructed by multi-point contact to increase enough support area to bear the applied stress, but the present disclosure is not limited thereto.

Figure 7:
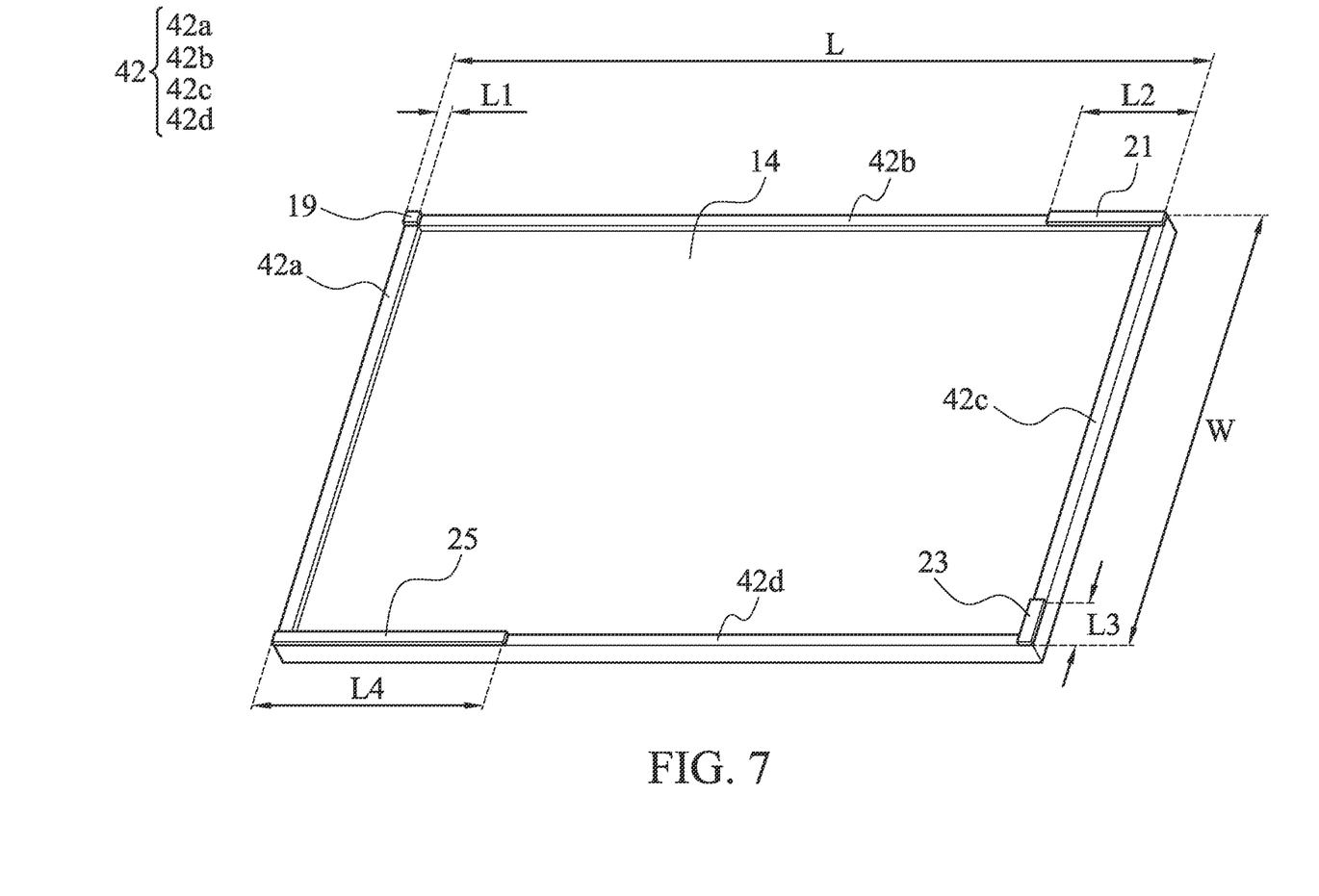
FIG. 7 is a schematic top view of some components of a display device in accordance with some embodiments of the present disclosure.

Referring to FIG. 7, according to some embodiments of the present disclosure, when there are three or more (for example, four) support elements in the display device, the appropriate dimensional relationship of the support elements is as illustrated. FIG. 7 is a schematic top view of some components of the display device. The rectangular backlight module 14 is used as an example for illustration, but the present disclosure is not limited thereto.

In FIG. 7, there are a total of four support elements, such as a first support element 19, a second support element 21, a third support element 23 and a fourth support element 25, which are disposed on the frame 42 of the backlight module 14, but the present disclosure is not limited thereto. The shapes of the contact surfaces between the support elements (including the first support element 19, the second support element 21, the third support element 23 and the fourth support element 25) and the frame 42 may be different. For example, the first support element 19 is circular. The second support element 21, the third support element 23 and the fourth support element 25 are respectively elongated, but the present disclosure is not limited thereto. The shapes of the contact surfaces between the support elements (including the first support element 19, the second support element 21, the third support element 23 and the fourth support element 25) and the frame 42 may also be the same. For example, the four support elements are all elongated. The frame 42 is disposed along the edge of the rectangular backlight module 14. The structural configuration of the frame 42 shown in FIG. 7 is similar to that of the frame 42 shown in FIG. 5. As shown in FIG. 7, the first support element 19 is disposed on the connection between the first portion 42a and the second portion 42b of the frame 42, and has a length of L1. The second support element 21 is disposed on the second portion 42b of the frame 42, adjacent to the third portion 42c of the frame 42, and has a length of L2. The third support element 23 is disposed on the third portion 42c of the frame 42, adjacent to the fourth portion 42d of the frame 42, and has a length of L3. The fourth support element 25 is disposed on the fourth portion 42d of the frame 42, adjacent to the first portion 42a of the frame 42, and has a length of L4. L1, L2, L3 and L4 may be the same or different. The length of any long side (the second portion 42b or the fourth portion 42d) of the frame 42 is L. The width of any short side (the first portion 42a or the third portion 42c) is W. The perimeter of the frame 42 is 2(L+W). In some embodiments, the ratio of the total length (L1+L2+L3+L4) of the first support element 19, the second support element 21, the third support element 23 and the fourth support element 25 to the perimeter (2(L+W)) of the frame 42 is less than or equal to about ¼ and greater than or equal to about ¹⁄₁₀. In some embodiments, the value range of the total length (L1+L2+L3+L4) of the first support element 19, the second support element 21, the third support element 23 and the fourth support element 25, when applied to a display area below 5 inch to 13 inch, may be less than or equal to about 250 mm and greater than or equal to about 30 mm. When applied to a display area of 13 inch to 60 inch, it may be less than or equal to about 800 mm and greater than or equal to about 250 mm. In some embodiments, when the number of support elements is n, the ratio of the total length of the first support element 19, the second support element 21, the third support element 23, the fourth support element 25, . . . , and the nth support element (L1+L2+L3+L4+ . . . +Ln) to the perimeter (2(L+W)) of the frame 42 still needs to be less than or equal to about ¼ and greater than or equal to about ¹⁄₁₀. In the embodiment shown in FIG. 7, the shape of the backlight module 14 is rectangular, but the present disclosure is not limited thereto. Other suitable shapes of the backlight module 14 are also applicable to the present disclosure, for example, oval or irregular. It is necessary to measure the ratio of the total length (L1+L2+L3+L4) of the first support element 19, the second support element 21, the third support element 23 and the fourth support element 25 to the perimeter (2(L+W)) of the frame 42 to be less than or equal to about ¼ and greater than or equal to about ¹⁄₁₀, or the value range of the total length (L1+L2+L3+L4) of the first support element 19, the second support element 21, the third support element 23 and the fourth support element 25 to be less than or equal to about 250 mm and greater than or equal to about 30 mm, or the value range of the total length (L1+L2+L3+L4) of the first support element 19, the second support element 21, the third support element 23 and the fourth support element 25 to be less than or equal to about 800 mm and greater than or equal to about 250 mm. When there are three or more support elements, if the shape of the contact surface between the support element and the frame is elongated, the length and width of the support element must be at least 0.5 mm or more. The total length of the support elements does not exceed ¼ of the perimeter of the frame at most. If the shape of the contact surface between the support element and the frame is circular, the diameter of the support element must be more than 0.5 mm. However, there is no minimum size limit for the top of the support element, for example, forming a cone.

Figure 8:
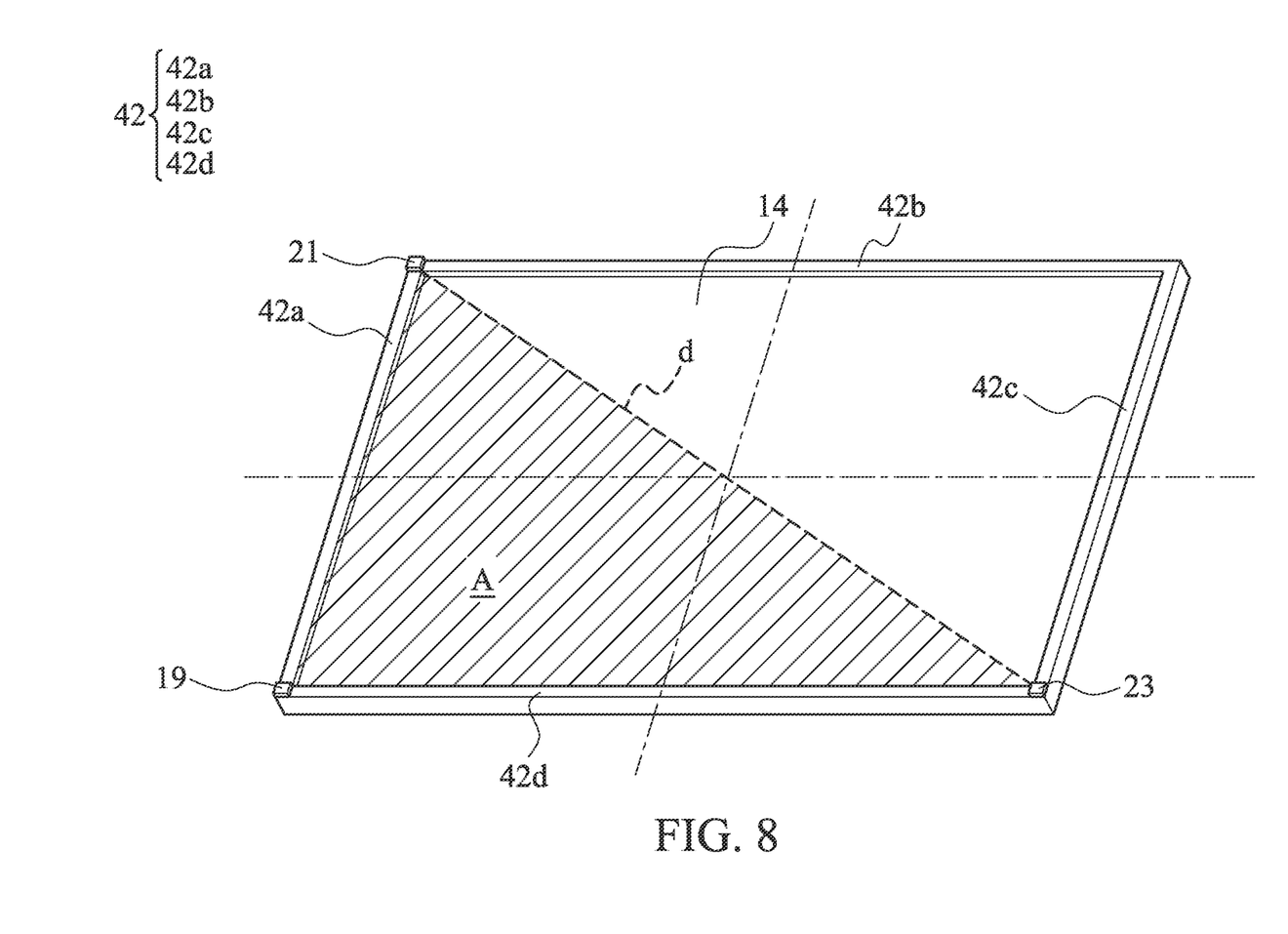
FIG. 8 is a schematic top view of some components of a display device in accordance with some embodiments of the present disclosure.

Referring to FIG. 8, according to some embodiments of the present disclosure, when there are three support elements in the display device, the appropriate position for the support elements is as illustrated. FIG. 8 is a schematic top view of some components of the display device. The rectangular backlight module 14 is used as an example for illustration, but the present disclosure is not limited thereto. Other suitable shapes of the backlight module 14 are also suitable for the present disclosure, such as oval or irregular shapes, etc.

In FIG. 8, the first support element 19, the second support element 21 and the third support element 23 are disposed on the frame 42 of the backlight module 14. The frame 42 is disposed along the edge of the rectangular backlight module 14. The structural configuration of the frame 42 shown in FIG. 8 is similar to that of the frame 42 shown in FIG. 5. As shown in FIG. 8, the first support element 19 is disposed on the junction of the first portion 42a and the fourth portion 42d of the frame 42. The second support element 21 is disposed on the junction of the first portion 42a and the second portion 42b of the frame 42. The third support element 23 is disposed on the junction of the third portion 42c and the fourth portion 42d of the frame 42. The connecting line "d" between the second support element 21 and the third support element 23, the first portion 42a of the frame 42, and the fourth portion 42d of the frame 42 define an area A. The ratio of the area of the area A to the area enclosed by the frame 42 is greater than or equal to about ¼.

Figure 9:
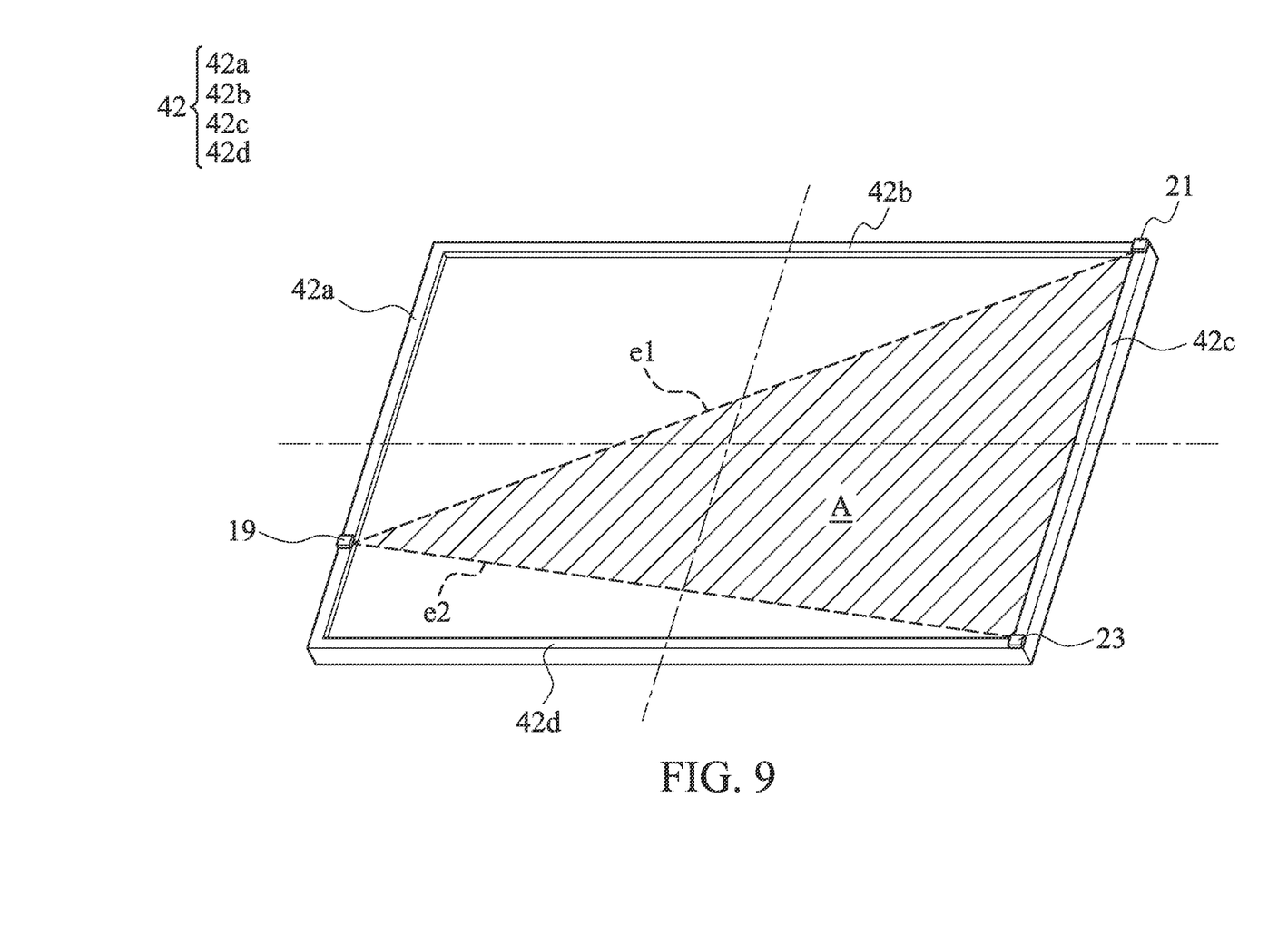
FIG. 9 is a schematic top view of some components of a display device in accordance with some embodiments of the present disclosure.

Referring to FIG. 9, according to some embodiments of the present disclosure, when there are three support elements in the display device, the appropriate position for the support elements is as illustrated. FIG. 9 is a schematic top view of some components of the display device. The rectangular backlight module 14 is used as an example for illustration, but the present disclosure is not limited thereto. Other suitable shapes of the backlight module 14 are also suitable for the present disclosure, such as oval or irregular shapes, etc.

In FIG. 9, the first support element 19, the second support element 21 and the third support element 23 are disposed on the frame 42 of the backlight module 14. The frame 42 is disposed along the edge of the rectangular backlight module 14. The structural configuration of the frame 42 shown in FIG. 9 is similar to that of the frame 42 shown in FIG. 5. As shown in FIG. 9, the first support element 19 is disposed anywhere on the first portion 42a of the frame 42. The second support element 21 is disposed on the junction of the second portion 42b and the third portion 42c of the frame 42. The third support element 23 is disposed on the junction of the third portion 42c and the fourth portion 42d of the frame 42. The connecting line "e1" between the first support element 19 and the second support element 21, the third portion 42c of the frame 42, and the connecting line "e2" between the first support element 19 and the third support element 23 define an area A. The ratio of the area of the area A to the area enclosed by the frame 42 is greater than or equal to about ¼.

Figure 10:
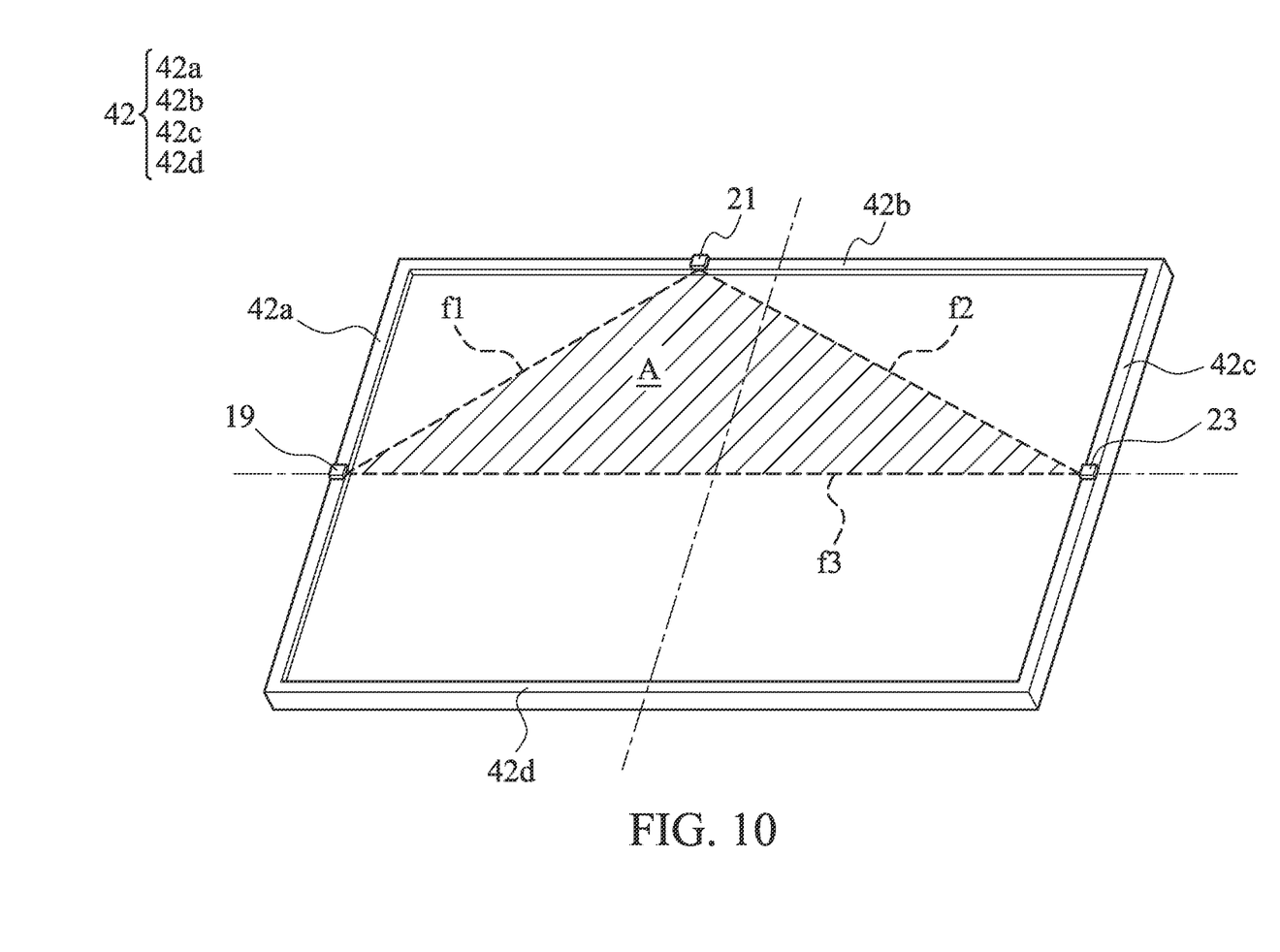
FIG. 10 is a schematic top view of some components of a display device in accordance with some embodiments of the present disclosure.

Referring to FIG. 10, according to some embodiments of the present disclosure, when there are three support elements in the display device, the appropriate position for the support elements is as illustrated. FIG. 10 is a schematic top view of some components of the display device. The rectangular backlight module 14 is used as an example for illustration, but the present disclosure is not limited thereto. Other suitable shapes of the backlight module 14 are also suitable for the present disclosure, such as oval or irregular shapes, etc.

In FIG. 10, the first support element 19, the second support element 21 and the third support element 23 are disposed on the frame 42 of the backlight module 14. The frame 42 is disposed along the edge of the rectangular backlight module 14. The structural configuration of the frame 42 shown in FIG. 10 is similar to that of the frame 42 shown in FIG. 5. As shown in FIG. 10, the first support element 19 is disposed anywhere on the first portion 42a of the frame 42. The second support element 21 is disposed anywhere on the second portion 42b of the frame 42. The third support element 23 is disposed anywhere on the third portion 42c of the frame 42. The connecting line "f1" between the first support element 19 and the second support element 21, the connecting line "f2" between the second support element 21 and the third support element 23, and the connecting line "f3" between the first support element 19 and the third support element 23 define an area A. The ratio of the area of the area A to the area enclosed by the frame 42 is greater than or equal to about ¼. In the embodiments shown in FIGS. 8-10, the first support element 19, the second support element 21 and the third support element 23 are disposed on the frame 42 of the backlight module 14 in an asymmetrical manner.

In some embodiments, the first support element 19, the second support element 21 and the third support element 23 may also be symmetrically disposed on the frame 42 of the backlight module 14. For example, in some embodiments, the first support element is disposed on the center point of the first portion of the frame. The second support element is disposed on the junction of the second portion and the third portion of the frame. The third support element is disposed on the junction of the third portion and the fourth portion of the frame. The connecting line between the first support element and the second support element, the third portion of the frame, and the connecting line between the first support element and the third support element define an area. The ratio of the area to the area enclosed by the frame is greater than or equal to about ¼. In some embodiments, the first support element is disposed on the junction of the first portion and the fourth portion of the frame. The second support element is disposed on the center point of the second portion of the frame. The third support element is disposed on the junction of the third portion and the fourth portion of the frame. The connecting line between the first support element and the second support element, the connecting line between the second support element and the third support element, and the fourth portion of the frame define an area. The ratio of the area to the area enclosed by the frame is greater than or equal to about ¼. In some embodiments, the first support element is disposed anywhere on the second portion of the frame. The second support element is disposed on the junction of the second portion and the third portion of the frame. The third support element is disposed on the junction of the third portion and the fourth portion of the frame. The connecting line between the first support element and the third support element, the second portion of the frame, and the third portion of the frame define an area. The ratio of the area to the area enclosed by the frame is greater than or equal to about ¼.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A display device, comprising:
    a display panel set having a peripheral zone;
    a backlight module comprising a frame;
    an adhesive material disposed between the peripheral zone of the display panel set and the frame; and
    a plurality of support elements disposed on the frame and in contact with the adhesive material, wherein the plurality of support elements comprise a first support element and a second support element,
    wherein a ratio of a total length of the first support element and the second support element to a perimeter of the frame is less than or equal to ¼ and greater than or equal to ¹⁄₁₀.

2. The display device as claimed in claim 1, wherein the support element has the same width as the frame.

3. The display device as claimed in claim 1, wherein the support element has a smaller width than that of the frame.

4. The display device as claimed in claim 1, wherein the support element has the same material as the frame.

5. The display device as claimed in claim 1, wherein the support element has a material different from that of the frame.

6. The display device as claimed in claim 1, wherein the support element comprises metal, plastic or polymer fibers.

7. The display device as claimed in claim 1, wherein the support element comprises solid glue, liquid glue, semi-solid glue, semi-liquid glue, tape, solvent-volatilization-type glue, polymerization-type glue or cooling-solidification-type glue.

8. The display device as claimed in claim 1, wherein the adhesive material is located on a top of the support element.

9. The display device as claimed in claim 1, wherein the adhesive material is located on a top and sidewalls of the support element.

10. The display device as claimed in claim 1, wherein the support element is solid.

11. The display device as claimed in claim 1, wherein the support element is hollow.

12. The display device as claimed in claim 11, wherein the adhesive material is filled into the support element.

13. The display device as claimed in claim 1, wherein contact surfaces between the support elements and the frame have different shapes.

14. The display device as claimed in claim 1, wherein a connecting line between a center point of the first support element and a center point of the second support element divides an area enclosed by the frame into a first area and a second area, and a ratio of the first area to the second area is greater than or equal to ¾.

15. The display device as claimed in claim 1, wherein a total length of the plurality of support elements is greater than or equal to 30 mm and less than or equal to 250 mm.

16. The display device as claimed in claim 1, wherein a total length of the plurality of support elements is greater than or equal to 250 mm and less than or equal to 800 mm.

17. A display device, comprising:
    a display panel set having a peripheral zone;
    a backlight module comprising a frame;
    an adhesive material disposed between the peripheral zone of the display panel set and the frame; and
    a plurality of support elements disposed on the frame and in contact with the adhesive material, wherein the plurality of support elements comprise a first support element, a second support element and a third support element,
    wherein a connecting line of the first support element, the second support element and the third support element defines an area, and a ratio of the area to an area enclosed by the frame is greater than or equal to ¼.

* * * * *